United States Patent
Zhao et al.

(10) Patent No.: US 9,153,507 B2
(45) Date of Patent: Oct. 6, 2015

(54) SEMICONDUCTOR PACKAGE WITH IMPROVED TESTABILITY

(75) Inventors: Sam Ziqun Zhao, Irvine, CA (US);
Kevin Kunzhong Hu, Irvine, CA (US);
Sampath K. V. Karikalan, Irvine, CA (US); Rezaur Rahman Khan, Rancho Santa Margarita, CA (US); Pieter Vorenkamp, Laguna Niguel, CA (US);
Xiangdong Chen, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 721 days.

(21) Appl. No.: 13/362,344

(22) Filed: Jan. 31, 2012

(65) Prior Publication Data

US 2013/0193996 A1  Aug. 1, 2013

(51) Int. Cl.
  G01R 31/02  (2006.01)
  H01L 21/66  (2006.01)
  H01L 23/31  (2006.01)
  H01L 23/498  (2006.01)
  H01L 21/56  (2006.01)
  H01L 23/00  (2006.01)

(52) U.S. Cl.
  CPC .............. *H01L 22/32* (2013.01); *H01L 21/561* (2013.01); *H01L 23/3128* (2013.01); *H01L 23/49811* (2013.01); *H01L 23/49827* (2013.01); *H01L 23/49833* (2013.01); *H01L 24/16* (2013.01); *H01L 2224/131* (2013.01); *H01L 2224/16225* (2013.01); *H01L 2224/16227* (2013.01); *H01L 2224/97* (2013.01)

(58) Field of Classification Search
  CPC ........................ H01L 23/49811; H01L 22/32
  USPC .......... 257/678, 685, 747; 324/754.01–754.3, 324/762.01–762.1
  See application file for complete search history.

(56) References Cited

U.S. PATENT DOCUMENTS

| | | | |
|---|---|---|---|
| 2007/0206908 A1 | 9/2007 | Cohen et al. | |
| 2008/0001241 A1* | 1/2008 | Tuckerman et al. | 257/434 |
| 2008/0153187 A1 | 6/2008 | Luo et al. | |
| 2009/0079065 A1* | 3/2009 | Furgut et al. | 257/724 |
| 2009/0322364 A1 | 12/2009 | Mangrum et al. | |
| 2012/0286814 A1* | 11/2012 | Wang et al. | 324/754.03 |

FOREIGN PATENT DOCUMENTS

| | | |
|---|---|---|
| CN | 1439101 A | 8/2003 |
| CN | 101101906 A | 1/2008 |
| CN | 101409279 A | 4/2009 |
| CN | 202816935 U | 3/2013 |
| KR | 10-2011-0036249 | 4/2011 |
| TW | 201021640 | 6/2010 |

* cited by examiner

*Primary Examiner* — Tung X Nguyen
(74) *Attorney, Agent, or Firm* — McDermott Will & Emery LLP

(57) ABSTRACT

An exemplary implementation of the present disclosure includes a testable semiconductor package that includes an active die having interface contacts and dedicated testing contacts. An interposer is situated adjacent a bottom surface of the active die, the interposer providing electrical connections between the interface contacts and a bottom surface of the testable semiconductor package. At least one conductive medium provides electrical connection between at least one of the dedicated testing contacts and a top surface of the testable semiconductor package. The at least one conductive medium can be coupled to a package-top testing connection, which may include a solder ball.

20 Claims, 6 Drawing Sheets

SEMICONDUCTOR PACKAGE WITH IMPROVED TESTABILITY

BACKGROUND

Testing occurs during or after manufacturing to ensure that semiconductor packages and dies are capable of meeting certain stringent operating requirements and standards. Exemplary tests that may be performed on a semiconductor package include various tests for active dies within the package, such as electrical signal timing tests, voltage and current level tests, at-speed tests, direct current tests, burn-in tests, room/cold tests, and hot sort tests. The semiconductor package would include at least one active die with interface contacts that are provided to a bottom surface of the semiconductor package. The interface contacts may be utilized for regular operation of the semiconductor package (i.e. operation out in the field). In addition to the interface contacts, the active die can include dedicated testing contacts that are also provided to the bottom surface of the semiconductor package. These dedicated testing contacts are utilized for testing, but not for regular operation of the semiconductor package.

In order to test the semiconductor package, it may be electrically connected to a testing equipment or device. An exemplary testing equipment or device may include a bottom portion and a top portion, where the bottom portion may receive all of the interface contacts and the dedicated testing contacts of the semiconductor package and the top portion may be utilized to physically hold the semiconductor package onto the bottom portion of the testing equipment or device. The semiconductor package may then be tested and screened for stringent operating requirements and standards. Subsequently, the semiconductor package may be used in the field in regular operation.

SUMMARY

The present disclosure is directed to a semiconductor package with improved testability, substantially as shown in and/or described in connection with at least one of the figures, and as set forth more completely in the claims.

DETAILED DESCRIPTION

Figure 1:
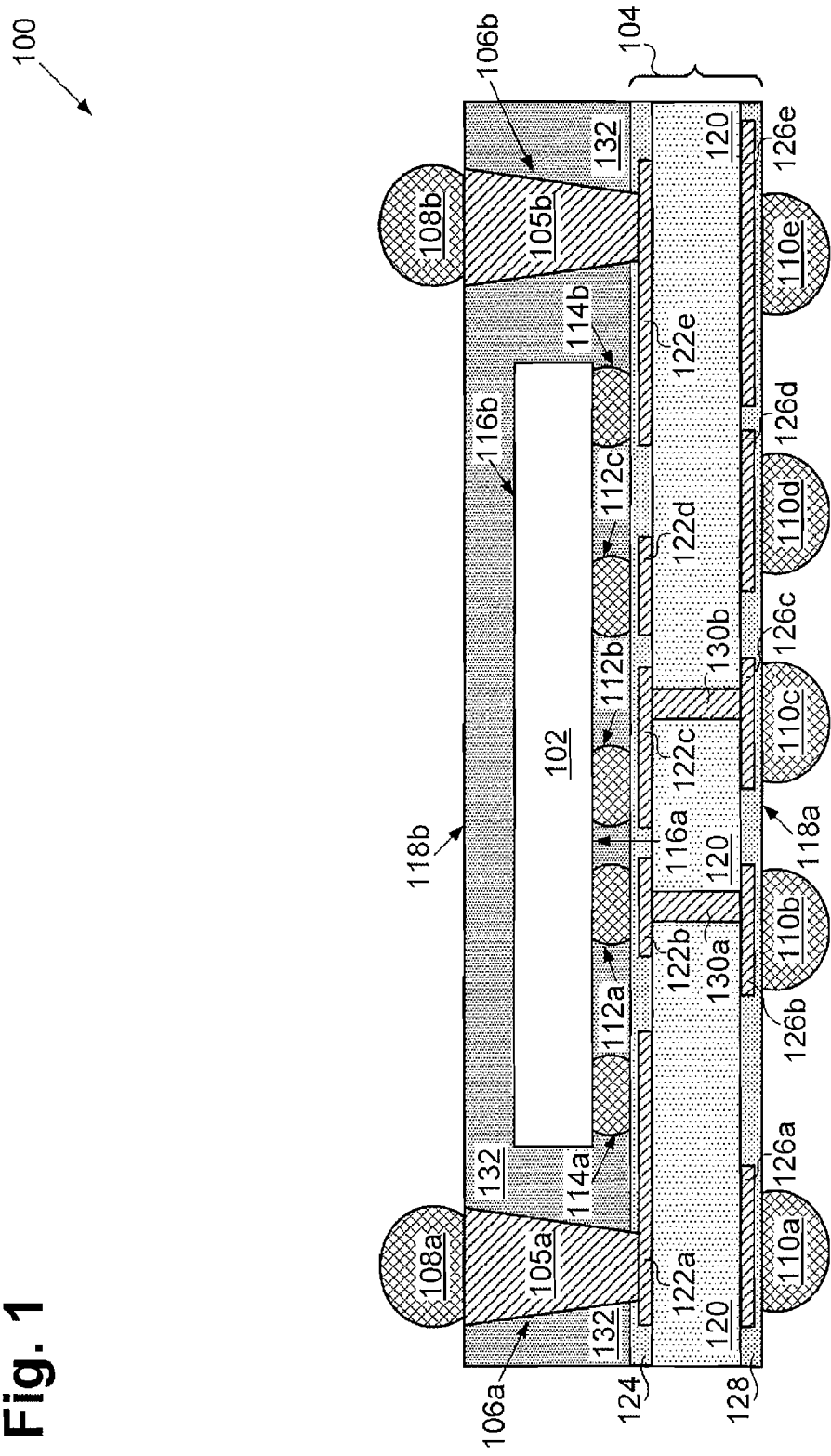
FIG. 1 presents an exemplary cross-sectional view of a testable semiconductor package, according to an implementation of the present disclosure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents testable semiconductor package 100 (also referred to as "package 100"), according to an implementation of the present disclosure. Package 100 includes active die 102, interposer 104 (or more generally "substrate 104"), conductive mediums 106a and 106b, package-top testing connections 108a and 108b (also referred to collectively as "package-top testing connections 108"), package-bottom connections 110a, 110b, 110c, 110d, and 110e (also referred to collectively as "package-bottom connections 110"), and molding 132.

Active die 102 has interface contacts 112a, 112b, and 112c (also referred to collectively as "interface contacts 112") and dedicated testing contacts 114a and 114b (also referred to collectively as "dedicated testing contacts 114"). Active die 102 can include, for example, an integrated circuit (IC), and other electrical components that are connected to interface contacts 112 and dedicated testing contacts 114. As shown in FIG. 1, in the present implementation, at least some of interface contacts 112 and dedicated testing contacts 114 include solder balls (e.g. micro-bumps), as one example. Interface contacts 112 are utilized for regular operation of package 100. In other words, interface contacts 112 are for regular operation out in the field. At least some of interface contacts 112 can have additional uses, such as for testing package 100. However, dedicated testing contacts 114 are utilized for testing, but not for regular operation of package 100.

While interface contacts 112 and dedicated testing contacts 114 are shown as being coupled to bottom surface 116a of active die 102, any of interface contacts 112 and dedicated testing contacts 114 can be coupled to different surfaces of active die 102 including top surface 116b. In such implementations, interface contacts 112 and dedicated testing contacts 114 can include bond wires or other connection means. Also, while only active die 102 is shown in FIG. 1, package 100 includes additional active dies in some implementations. The additional dies can have additional interface contacts 112 and dedicated testing contacts 114.

In package 100, interposer 104 is situated adjacent bottom surface 116a of active die 102. Interposer 104 is providing electrical connections between interface contacts 112 and bottom surface 118a of package 100. In the present implementation, interposer 104 includes substrate core 120, top metal layer segments 122a, 122b, 122c, 122d, and 122e (also referred to collectively as "top metal layer segments 122"), top solder mask 124, bottom metal layer segments 126a, 126b, 126c, 126d, and 126e (also referred to collectively as "bottom metal layer segments 126"), bottom solder mask 128, and vias 130a and 130b (also referred to collectively as "vias 130"). In some implementations vias 130 are through semiconductor vias (TSVs).

Substrate 104 include, as examples, an organic-substrate, a laminate substrate, and a ceramic substrate. In the present implementation substrate 104 includes a laminate substrate. Substrate 104 is shown as having top metal layer segments 122 and bottom metal layer segments 126, but can include more than two layers of metal segments.

Also in package 100, interface contacts 112 are electrically connected to package-bottom connections 110 through interposer 104. Package-bottom connections 110 are electrically connected to at least some of bottom metal layer segments 126. In the present implementation, at least some of package-bottom connections 110 are solder balls and can form a ball grid array (BGA). However, package 100 can include different types of package-bottom connections 110 or not include package-bottom connections 110 in various implementations. In the present implementation, package-bottom connections 110 are situated on at least some of bottom metal layer segments 126 through respective openings in bottom solder mask 128. It is noted that interposer 104 can have many different forms and is presented as one example.

Package 100 further includes conductive mediums 106 providing electrical connection between dedicated testing contacts 114 and top surface 118b of package 100. For example, conductive medium 106a is providing electrical connection between dedicated testing contact 114a and top surface 118b and conductive medium 106b is providing electrical connection between dedicated testing contact 114b and top surface 118b. Thus, dedicated testing contacts 114 are available for testing on top surface 118b of package 100.

In some cases, bottom surface 118a is considered highly valuable package area. For example, it may be desirable to provide all or most of interface contacts 112 to bottom surface 118a for regular operation of package 100. As one example, it may be easier to deploy package 100 out in the field. However, having dedicated testing contacts 114 provided to bottom surface 118a may, for example, hinder providing some of interface contacts 112 to bottom surface 118a. By providing dedicated testing contacts 114 to top surface 118b of package 100 instead of to bottom surface 118a of package 100, additional space can be created on bottom surface 118a for, for example, interface contacts 112 or for other purposes. As such, in some implementations, it may be easier to provide all or most of interface contacts 112 to bottom surface 118a for regular operation of package 100. Furthermore, it may be possible to provide additional interface contacts 112 to bottom surface 118a, thereby enhancing functionality of package 100. Additionally, it may be possible to reduce the overall footprint or package size of package 100.

In the present implementation, top metal layer segments 122 are providing electrical connection between dedicated testing contacts 114 and conductive mediums 106. For example, top metal layer segment 122a is providing electrical connection between dedicated testing contact 114a and conductive medium 106a. Conductive mediums 106 are coupled to respective package-top testing connections 108. Package-top testing connections 108 are shown as being solder balls. However, some implementations do not include package-top testing connections 108 or include different types of package-top testing connections 108.

Also in the present implementation, conductive mediums 106 include through mold vias (TMVs) 105a and 105b (also referred to as "conductive via 105a" and "conductive via 105b") that are situated within molding 132, which encloses active die 102. In the implementation shown, conductive mediums 106 traverse bottom surface 116a and top surface 116b of active die 102. Forming conductive mediums 106 can include, for example, forming vias through molding 132 and top solder mask 124 and filling the vias with conductive material that can include, as examples, a metal or metal alloy to form TMVs 105a and 105b. Although not shown, dedicated testing contacts 114 can be provided to anywhere on top surface 118b, including directly over active die 102. In some implementations, at least some of dedicated testing contacts 114 are on top surface 116b of active die 102 and are provided to top surface 118b using, any suitable conductive medium, such as a TMV.

In various implementations, package 100 can be, as examples, a fine ball grid array (FBGA) package, a flip chip (FC) package, a quad-flat no-leads (QFN) package, a top probe interposer package, a wafer level package, a package-on-package (PoP) type package, or other type of package not specifically described herein. While implementations shown herein include molding 132, other implementations do not include molding 132. Furthermore, conductive mediums 106 can take many different forms from what is shown in FIG. 1. As another example, FIG. 2 presents testable semiconductor package 200 (also referred to as "package 200"), according to an implementation of the present disclosure.

Package 200 corresponds to package 100 in FIG. 1. Thus, at least some similar and/or same elements between FIGS. 1 and 2 are not specifically described with respect to FIG. 2. Package 200 includes active die 202, conductive mediums 206a and 206b, dedicated testing contacts 214a and 214b, bottom surface 216a, top surface 216b, top surface 218b, top metal layer segments 222a and 222e, and molding 232 corresponding respectively to active die 102, conductive mediums 106a and 106b, dedicated testing contacts 114a and 114b, bottom surface 116a, top surface 116b, top surface 118b, top metal layer segments 122a and 122e, and molding 132 in FIG. 1.

Figure 2:
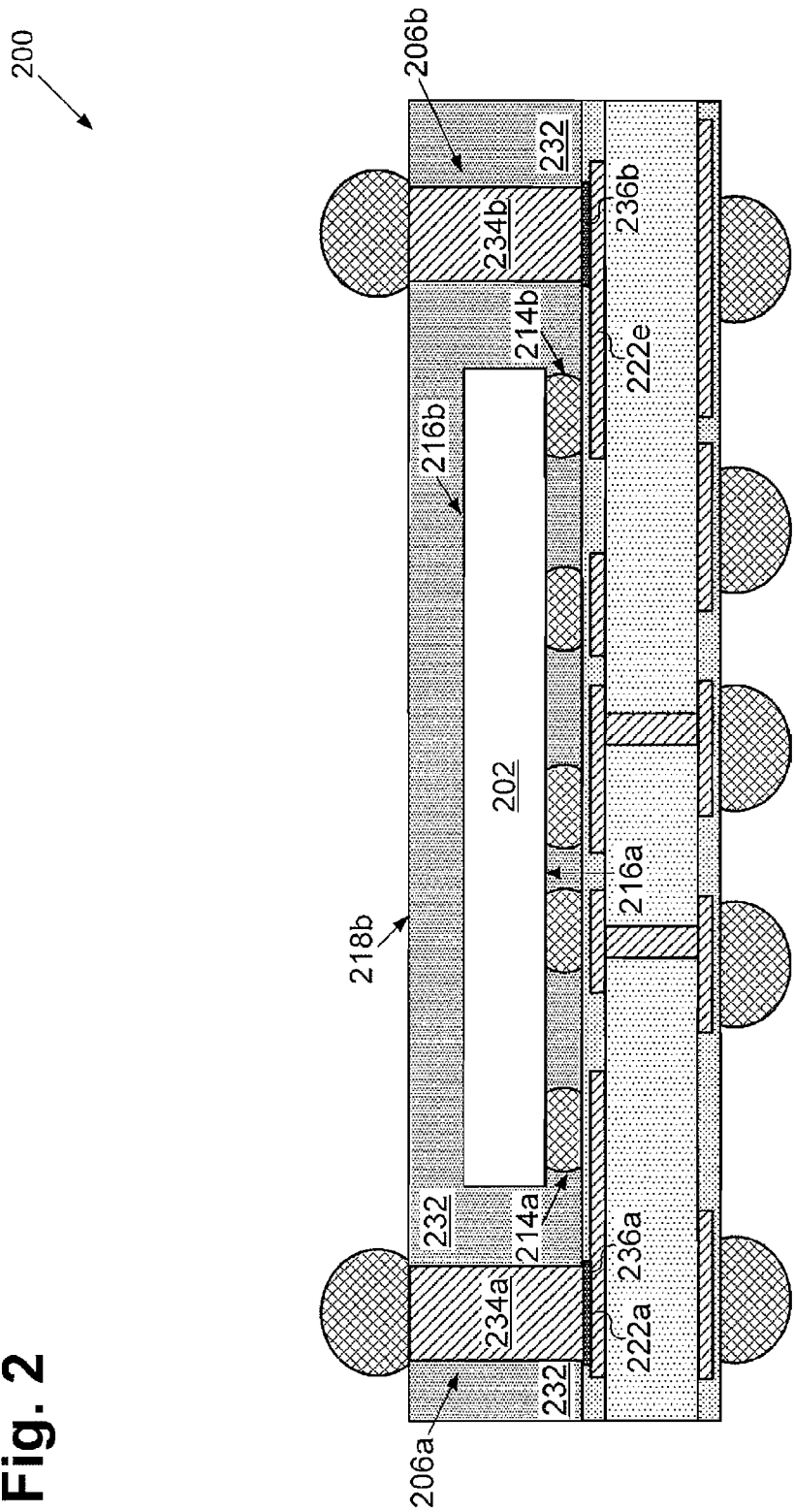
FIG. 2 presents an exemplary cross-sectional view of a testable semiconductor package, according to an implementation of the present disclosure.

In FIG. 2, conductive medium 206a includes conductive block 234a, which is attached to top metal layer segment 222a using solder 236a. Similarly, conductive medium 206b includes conductive block 234b, which is attached to top metal layer segment 222e using solder 236b. Conductive blocks 234a and 234b can include conductive material, such as a metal or metal alloy, and can have any suitable shape. In one implementation conductive blocks 234a and 234b are copper blocks. Forming package 200 can include, for example, soldering conductive blocks 234a and 234b to respective top metal layer segments 222a and 222e and subsequently forming molding 232 over conductive blocks 234a and 234b. Although not shown, in some implementations, at least some dedicated testing contacts (e.g. dedicated testing contacts 214a and 214b) are on top surface 216b of active die 202 and are provided to top surface 218b using, for example, a copper block.

Figure 3:
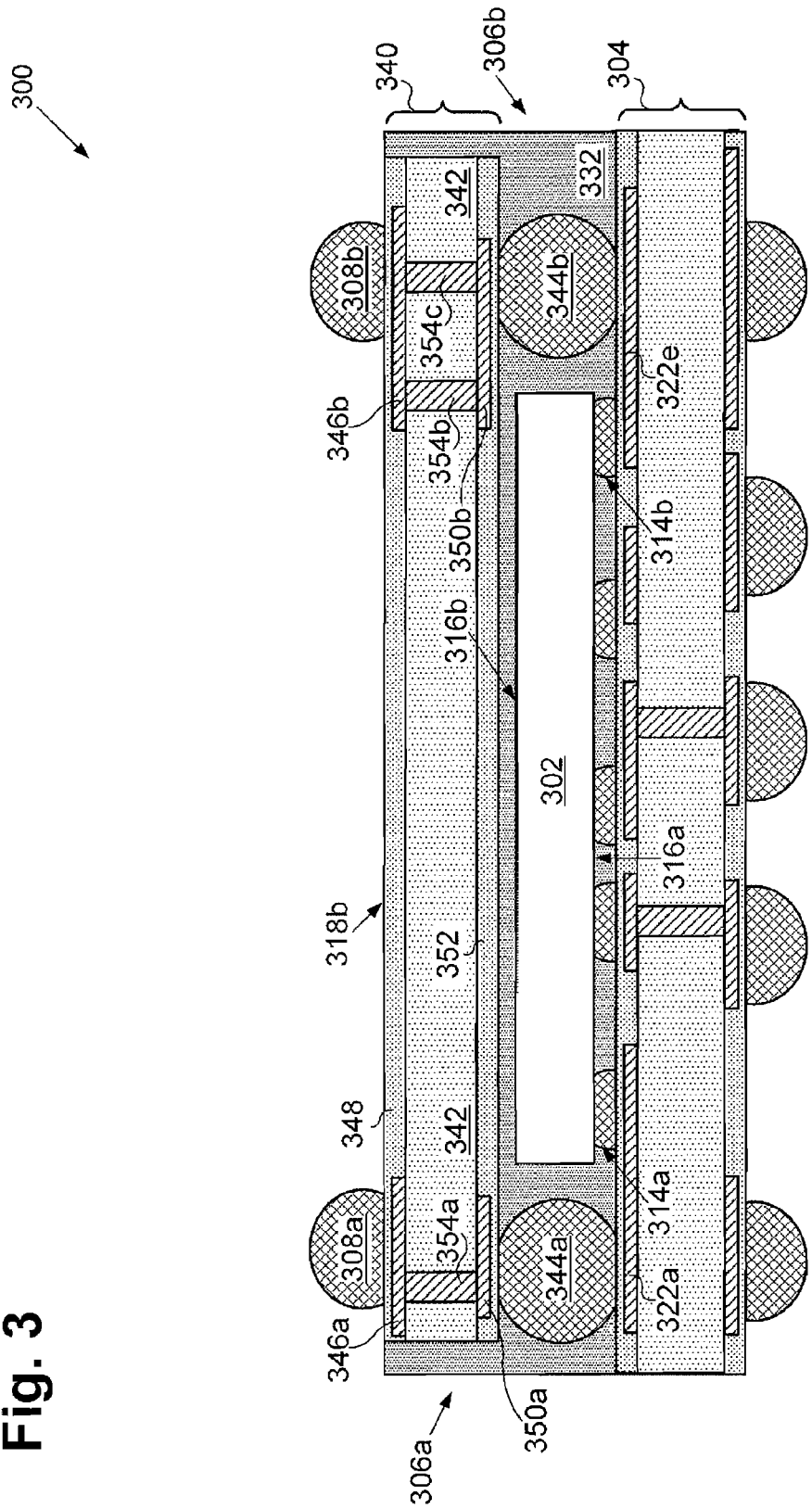
FIG. 3 presents an exemplary cross-sectional view of a testable semiconductor package, according to an implementation of the present disclosure.

As another example, FIG. 3 presents testable semiconductor package 300 (also referred to as "package 300"), according to an implementation of the present disclosure.

Package 300 corresponds to package 100 in FIG. 1. Thus, at least some similar and/or same elements between FIGS. 1 and 3 are not specifically described with respect to FIG. 3. Package 300 includes active die 302, lower interposer 304 (or more generally "lower substrate 304"), conductive mediums 306a and 306b, package-top testing connections 308a and 308b, dedicated testing contacts 314a and 314b, bottom surface 316a, top surface 316b, top surface 318b, top metal layer segments 322a and 322e, and molding 332 corresponding respectively to active die 102, interposer 104, conductive mediums 106a and 106b, package-top testing connections 308a and 308b, dedicated testing contacts 114a and 114b, bottom surface 116a, top surface 116b, top surface 118b, top metal layer segments 122a and 122e, and molding 132 in FIG. 1.

Package 300 also includes upper interposer 340 (or more generally "upper substrate 340") situated adjacent top surface 316b of active die 302. Upper interposer 340 can be, as examples, a silicon interposer, a laminate substrate, and the like. As upper interposer 340 is a silicon interposer in the present implementation, upper interposer 340 includes substrate core 342, top metal layer segments 346a and 346b, top solder mask (or passivation) 348, bottom metal layer segments 350a and 350b, bottom solder mask (or passivation) 352, and vias 354a, 354b, and 354c. Vias 354a, 354b, and 354c are through semiconductor vias (TSVs) in the present implementation. Upper interposer 340 can be a similar type of interposer or substrate as lower interposer 304 as shown in FIG. 3, or can be a different type of interposer or substrate as lower interposer 304.

In the implementation shown in FIG. 3, at least a portion of conductive medium 306a is formed in upper interposer 340. Additionally, at least a portion of conductive medium 306b is formed in upper interposer 340. For example, conductive medium 306a includes top metal layer segment 346a, bottom metal layer segment 350a, via 354a, and interconnect solder ball 344a. Conductive medium 306b includes top metal layer segment 346b, bottom metal layer segment 350b, vias 354b and 354c, and interconnect solder ball 344b. Top metal layer segments 346a and 346b, bottom metal layer segments 350a and 350b, and vias 354a, 354b, and 354c are formed in upper interposer 340.

In the implementation shown, interconnect solder ball 344a is electrically connecting bottom metal layer segment 350a of upper interposer 340 to top metal layer segment 322a of lower interposer 304. Package-top testing connection 308a is situated on and electrically connected to top metal layer segment 346a through an opening in top solder mask 348. Similarly, interconnect solder ball 344b is electrically connecting bottom metal layer segment 350b of upper interposer 340 to top metal layer segment 322e of lower interposer 304. Package-top testing connection 308b is situated on and electrically connected to top metal layer segment 346b through an opening in top solder mask 348. By forming at least a portion of conductive mediums 306a and 306b in upper interposer 340, package 300 can easily support robust routing capabilities for providing dedicated testing contacts 314a and 314b to top surface 318b.

Figure 4A:
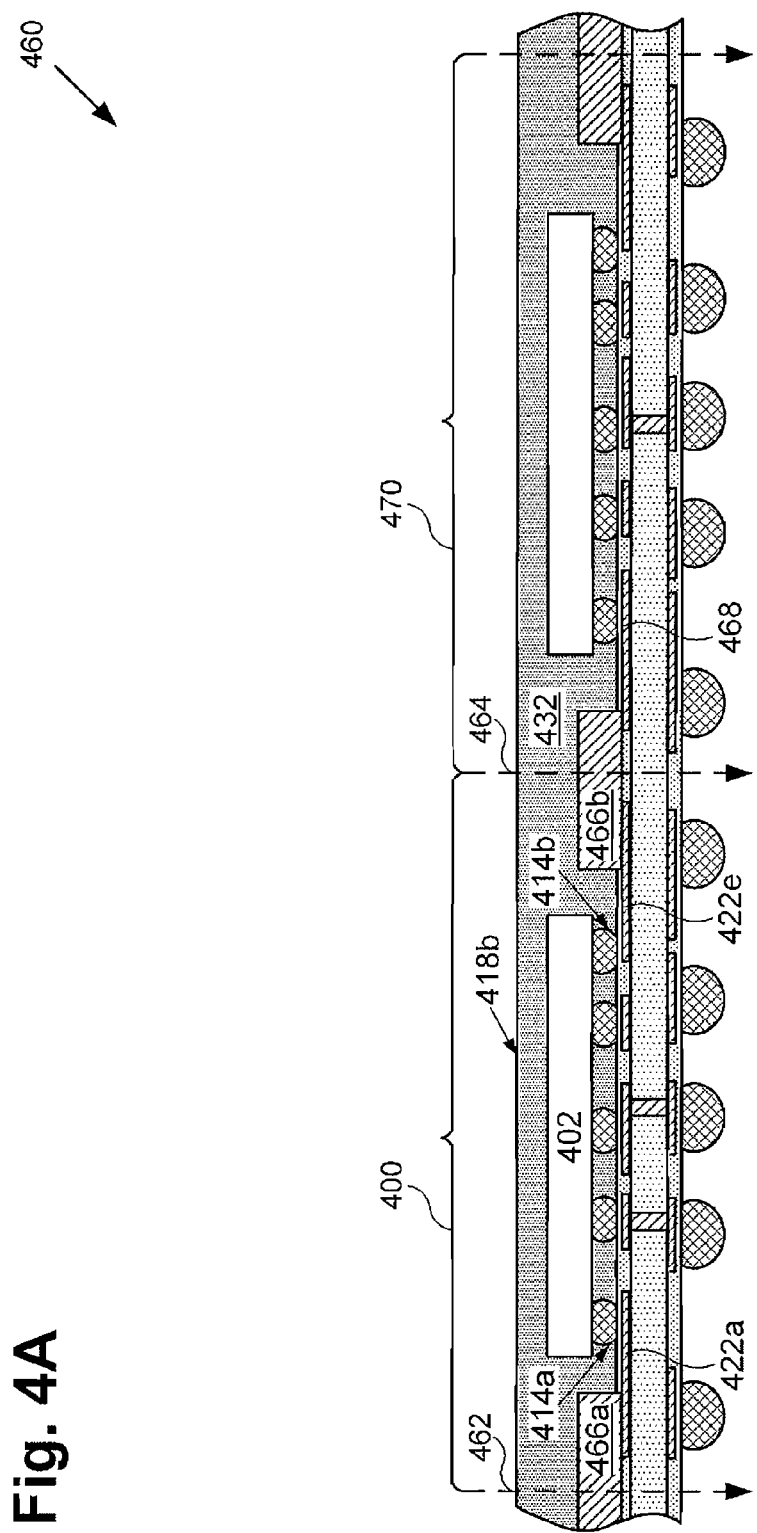
FIG. 4A presents an exemplary cross-sectional view of testable semiconductor packages prior to singulation, according to an implementation of the present disclosure.
Figure 4B:
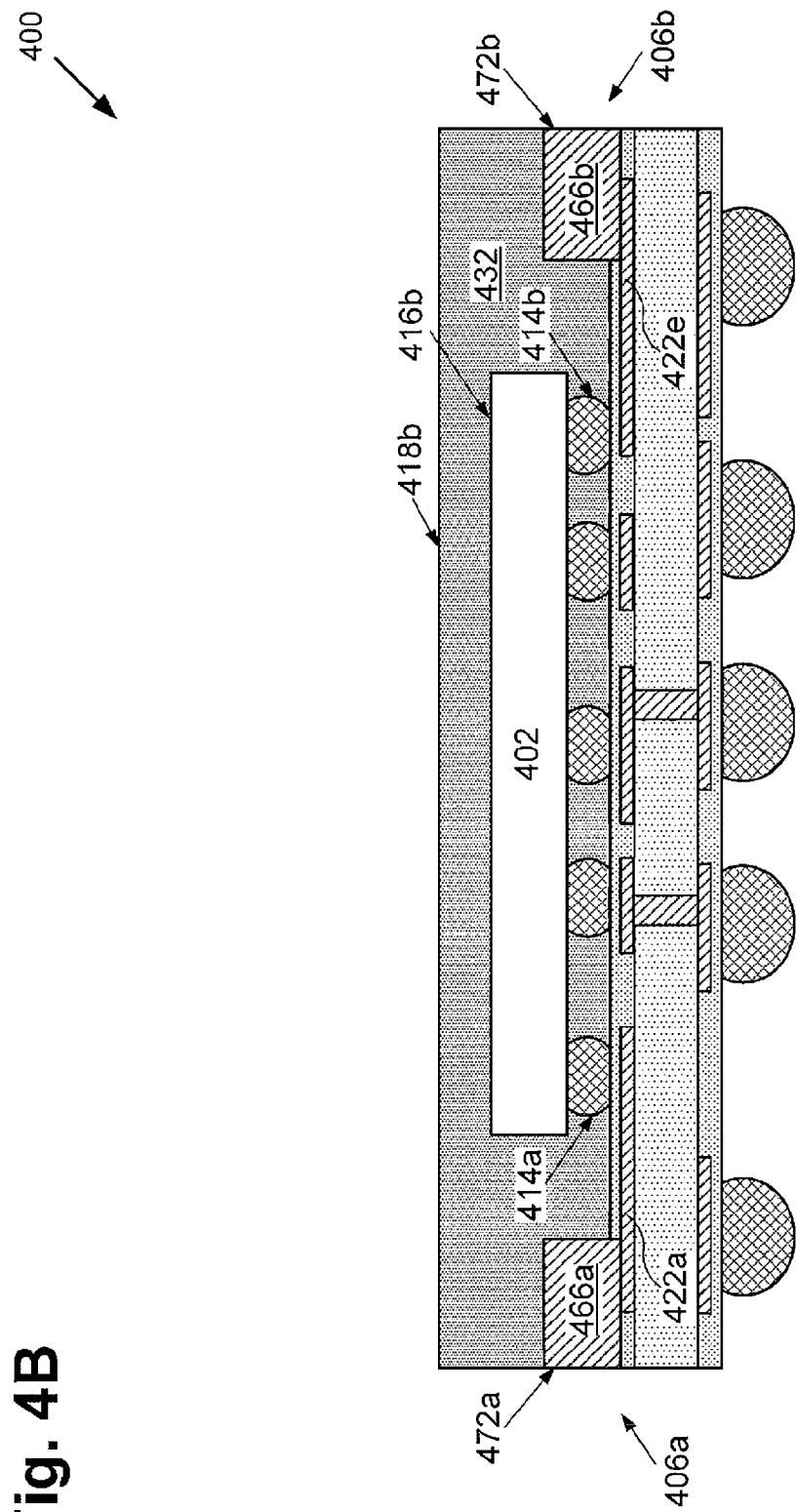
FIG. 4B presents an exemplary cross-sectional view of a testable semiconductor package after singulation, according to an implementation of the present disclosure.

Implementations described with respect to FIGS. 1, 2, and 3 show where at least one conductive medium is providing electrical connection between at least one dedicated testing contact and a top surface of a testable semiconductor package. Additionally, or instead, in some implementations, at least one conductive medium is providing electrical connection between at least one dedicated testing contact and a sidewall of a testable semiconductor package. For example, FIG. 4A presents structure 460 including testable semiconductor packages 400 and 470 prior to singulation, according to an implementation of the present disclosure. FIG. 4B presents testable semiconductor package 400 (also referred to as "package 400") after being singulated from structure 460 along dicing lines 462 and 464.

Package 400 corresponds to package 100 in FIG. 1. Thus, at least some similar and/or same elements between FIGS. 1 and 4A and 4B are not specifically described with respect to FIGS. 4A and 4a FIGS. 4A and 4B show active die 402, conductive mediums 406a and 406b, dedicated testing contacts 414a and 414b, top surface 416b, top surface 418b, and top metal layer segments 422a and 422e corresponding to active die 102, conductive mediums 106a and 106b, dedicated testing contacts 114a and 114b, top surface 116b, top surface 118b, and top metal layer segments 122a and 122e in FIG. 1.

As shown in FIG. 4A, structure 460 includes conductive blocks 466a and 466b, which can be similar to copper blocks 234a and 234b in FIG. 2. Thus, for example, conductive blocks 466a and 466b can comprise similar materials as conductive blocks 234a and 234b and can similarly be soldered respectively to top metal layer segments 422a and 422b. Molding 432 can subsequently be formed over conductive blocks 466a and 466b. As shown in FIG. 4A, conductive block 466b is connected to top metal layer segment 422e of package 400 and top metal layer segment 468 of testable semiconductor package 470, which can be similar to semiconductor package 400.

After singulating package 400 along dicing lines 462 and 464, conductive blocks 466a and 466b are on sidewalls 472a and 472b of package 400 as shown in FIG. 4B. Conductive medium 406a includes conductive block 466a and conductive medium 406b includes conductive block 466b. Thus, FIGS. 4A and 4B demonstrate one example where at least one conductive medium (e.g. conductive medium 406a) is providing electrical connection between at least one dedicated testing contact (e.g. dedicated testing contact 414a) and a sidewall (e.g. sidewall 472a) of a testable semiconductor package (e.g. testable semiconductor package 400). FIG. 4A additionally includes conductive medium conductive medium 406b providing electrical connection between dedicated testing contact 414b and sidewall 472b of testable semiconductor package 400. It is noted that in some implementations, at least some of dedicated testing contacts 414 are on top surface 4166 of active die 402 and are provided to sidewall 472a and/or sidewall 472b using, any suitable conductive medium, such as a copper block.

As discussed above, package 400 can further include, for example, at least one conductive medium, instead of or in addition to conductive medium 406a, that is providing electrical connection between, for example, dedicated testing contact 414a and top surface 418b of package 400. In various implementations, the at least one conductive medium can be similar to or different than any of conductive mediums 106a, 206a, and 306a in FIGS. 1, 2, and 3.

Furthermore, FIGS. 4A and 4B offer an efficient example for fabricating package 400. However, package 400 can be fabricated many different ways and conductive mediums 406a and 406b are not limited by the implementation shown. In various implementations, package 400 can provide some similar advantages as described above with respect to packages 100, 200, and 300.

Figure 5:
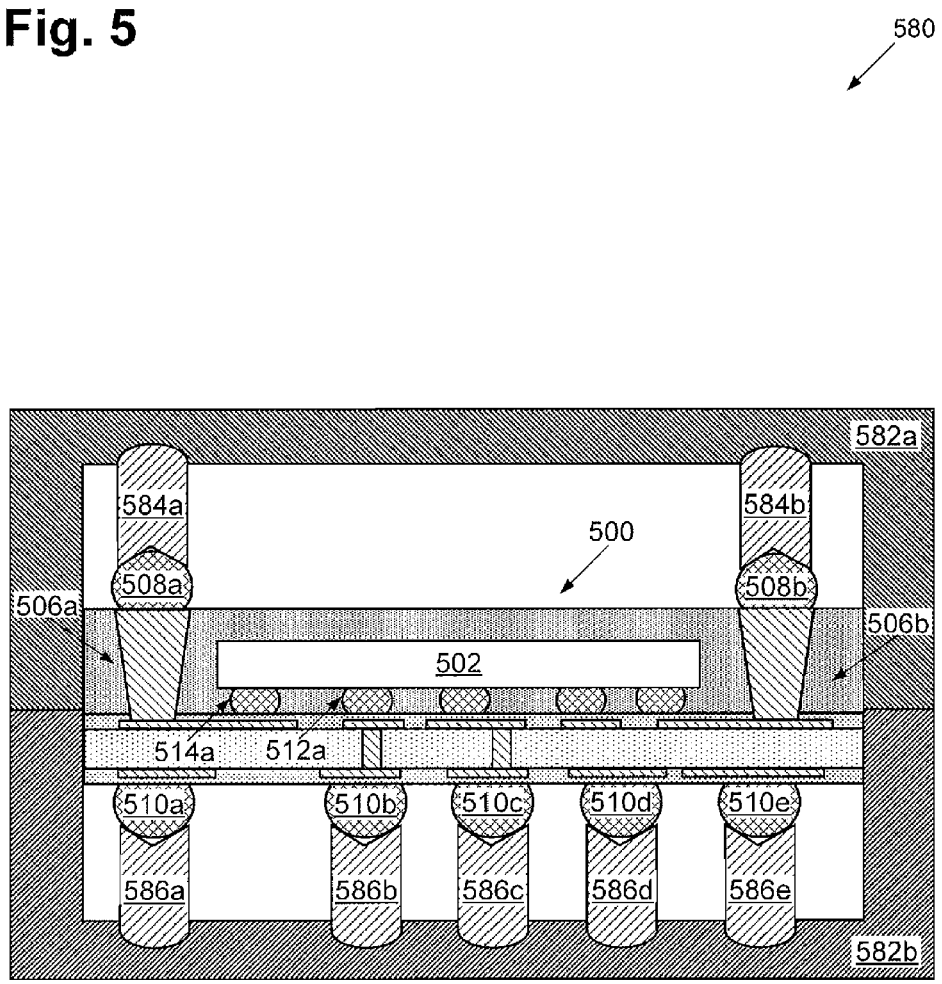
FIG. 5 presents an exemplary cross-sectional view of a system for testing a semiconductor package, according to an implementation of the present disclosure.

Referring now to FIG. 5, FIG. 5 presents system 580 for testing semiconductor package 500 (also referred to as "package 500"), according to an implementation of the present disclosure. System 580 includes package 500, top testing socket 582a and bottom testing socket 582b. Package 500 can correspond to any of previously described packages 100, 200, 300, and 400, and to packages not specifically described herein. In the implementation shown, package 500 most closely corresponds to package 100 in FIG. 1.

Top testing socket 582a is electrically connected to dedicated testing contact 514a through conductive medium 506a for testing package 500. In the implementation shown, top testing socket 582a is electrically connected to dedicated testing contact 514a through package-top testing connection 508a, which is a solder ball. As shown in FIG. 5, top testing socket 582a has top probes 584a and 584b for contacting package 500. More particularly, top probe 584a is connected to dedicated testing contact 514a and top probe 584b is connected to dedicated testing contact 514b. In the present implementation, top probes 584a and 584b are pogo pins.

Bottom testing socket 582b is connected to package-bottom connections 510. As shown in FIG. 5, bottom testing socket 582b has bottom probes 586a, 586b, 586c, 586d, and 586e (also referred to collectively as "bottom probes 586") for contacting package 500. In the present implementation, bottom probes 586 are pogo pins. In some implementations, at least some of bottom probes 586 are electrically connected to package-bottom connections 510 for testing package 500. In some implementations, at least some of bottom probes 586 are connected to package-bottom connections 510 only for structural support of package 500.

Furthermore, while each of package-bottom connections 510 is shown as having a corresponding bottom probe 586, in some implementations, at least one of package-bottom connections 510 is not directly contacting bottom testing socket 582b. For example, bottom probe 586b could be removed. By doing so, there is less likelihood for damaging package-bottom connections 510 during testing of package 500. In particular, bottom probes 586 for respective interface contacts (e.g. interface contact 512a) that are not utilized for testing could be removed.

In some implementations, package 500 does not include at least one of package-top testing connections 508 and top probes 584 can contact conductive mediums 506 directly. Similarly, in some implementations, package 500 does not include package-bottom connections 510. Furthermore, top probes 584 and/or bottom probes 586 can be adapted for implementations where at least one conductive medium is providing electrical connection between at least one dedicated testing contact and a sidewall of a testable semiconductor package (e.g. package 400).

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A testable semiconductor package comprising:
   an active die having interface contacts and dedicated testing contacts;
   an interposer situated adjacent to a bottom surface of said active die, said interposer providing electrical connections between said interface contacts and a bottom surface of said testable semiconductor package; and
   at least one conductive medium providing electrical connection between at least one of said dedicated testing contacts and a top surface of said testable semiconductor package.

2. The testable semiconductor package of claim 1, wherein said at least one conductive medium is coupled to a package-top testing connection.

3. The testable semiconductor package of claim 2, wherein said package-top testing connection comprises a solder ball.

4. The testable semiconductor package of claim 1, wherein said at least one conductive medium comprises a conductive via.

5. The testable semiconductor package of claim 1, wherein said at least one conductive medium comprises a conductive block.

6. The testable semiconductor package of claim 1, wherein at least a portion of said at least one conductive medium is formed in an upper interposer.

7. The testable semiconductor package of claim 1, comprising at least one top metal layer segment providing electrical connection between at least one of said dedicated testing contacts and said at least one conductive medium.

8. The testable semiconductor package of claim 1, wherein said interface contacts are electrically connected to package-bottom connections.

9. The testable semiconductor package of claim 8, wherein said package-bottom connections comprise solder balls.

10. The testable semiconductor package of claim 1, comprising a molding that encloses said active die.

11. A testable semiconductor package comprising:
    an active die having interface contacts and dedicated testing contacts;
    an interposer situated adjacent to a bottom surface of said active die, said interposer providing electrical connections between said interface contacts and a bottom surface of said testable semiconductor package; and
    at least one conductive medium providing electrical connection between at least one of said dedicated testing contacts and a sidewall of said testable semiconductor package.

12. The testable semiconductor package of claim 11, wherein said at least one conductive medium comprises a conductive block.

13. The testable semiconductor package of claim 11, comprising at least one top metal layer segment providing electrical connection between at least one of said dedicated testing contacts and said at least one conductive medium.

14. The testable semiconductor package of claim 11, comprising a molding that encloses said active die.

15. A method for providing a testable semiconductor package, the method comprising:
    forming an active die having interface contacts and dedicated testing contacts;
    forming an interposer adjacent to a bottom surface of the active die;
    providing electrical connections, through the interposer, between the interface contacts and a bottom surface of the testable semiconductor package; and
    forming at least one conductive medium to provide electrical connection between at least one of the dedicated testing contacts and a top surface of the testable semiconductor package.

16. The method of claim 15, further comprising coupling the at least one conductive medium to a package-top testing connection.

17. The method of claim 16, wherein the package-top testing connection comprises a solder ball.

18. The method of claim 15, wherein forming the at least one conductive medium comprises forming a conductive via.

19. The method of claim 15, wherein forming the at least one conductive medium comprises forming a conductive block.

20. The method of claim 15, further comprising forming at least a portion of the at least one conductive medium in an upper interposer.

* * * * *